US010094866B2

(12) United States Patent
Davis

(10) Patent No.: US 10,094,866 B2
(45) Date of Patent: Oct. 9, 2018

(54) PORTABLE MULTI-FUNCTION CABLE TESTER

(71) Applicant: The United States of America as represented by the Secretary of the Navy, Washington, DC (US)

(72) Inventor: Brent E. Davis, Bloomington, IN (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 354 days.

(21) Appl. No.: 14/676,783

(22) Filed: Apr. 1, 2015

(65) Prior Publication Data

US 2015/0316600 A1 Nov. 5, 2015

Related U.S. Application Data

(60) Provisional application No. 61/973,319, filed on Apr. 1, 2014.

(51) Int. Cl.
*G01R 31/02* (2006.01)
*G01R 3/00* (2006.01)
(Continued)

(52) U.S. Cl.
CPC ............. *G01R 31/026* (2013.01); *G01R 3/00* (2013.01); *G01R 31/021* (2013.01); *G01R 1/04* (2013.01);
(Continued)

(58) Field of Classification Search
CPC .... G01R 31/026; G01R 31/021; G01R 31/11; G01R 3/00; G01R 1/04; G01R 1/0416; Y10T 29/49171
(Continued)

(56) References Cited

U.S. PATENT DOCUMENTS 4,445,086 A 4/1984 Bulatao
4,471,293 A 9/1984 Schnack
(Continued)

FOREIGN PATENT DOCUMENTS

WO   WO 88/03653   5/1988

OTHER PUBLICATIONS

Model 550 Continuity Tester product literature, DataSwitch Corporation, 2013; available at http://www.dataswitchcorp.com/test-equipment/continuity-testers/model-550.html; 2 pgs.

*Primary Examiner* — Patrick Assouad
*Assistant Examiner* — Khristopher Yodichkas
(74) *Attorney, Agent, or Firm* — Christopher A. Monsey

(57) ABSTRACT

The methods and apparatus described herein are designed and configured to allow one user to test cable continuity using a wire-configurable directional connector. The methods and apparatus may transmit a first and second voltage pulse through a first and second wire of a cable under test, respectively, having a wire-configurable directional connector attached. Both voltage pulses travel through the wire-configurable directional connector. The first voltage pulse selectively leaves at least one of the second wire and a third wire of the cable under test and the second voltage pulse selectively leaves the third wire. The methods and apparatus may store a pre-determined pattern of a returning voltage pulse specific to the cable under test, and determine a state of the first, second, and third wires in response to receiving the first and second voltage pulses.

3 Claims, 16 Drawing Sheets

(51) Int. Cl.
*G01R 31/11* (2006.01)
*G01R 1/04* (2006.01)

(52) U.S. Cl.
CPC ............ *G01R 1/0416* (2013.01); *G01R 31/11* (2013.01); *Y10T 29/49171* (2015.01)

(58) Field of Classification Search
USPC ........................................................ 324/543
See application file for complete search history.

(56) References Cited

U.S. PATENT DOCUMENTS

| | | |
|---|---|---|
| 4,527,118 A | 7/1985 | Koslar |
| 4,769,596 A | 9/1988 | Faucett |
| 5,272,438 A | 12/1993 | Stumme |
| 5,414,343 A * | 5/1995 | Flaherty ............... G01R 31/024 324/539 |
| 6,230,109 B1 | 5/2001 | Miskimins et al. |
| 6,445,196 B1 | 9/2002 | White |
| 7,816,925 B1 | 10/2010 | Gale |
| 7,884,616 B2 | 2/2011 | Oruganty |
| 2005/0083067 A1 | 4/2005 | Kirbas |
| 2007/0001683 A1 | 1/2007 | Krigel |
| 2009/0189625 A1 | 7/2009 | Taunton |
| 2013/0162262 A1 | 6/2013 | Johnson et al. |
| 2014/0340111 A1 | 11/2014 | Mercadal et al. |

\* cited by examiner

206

TEST RESULTS

| | WIRE 106 | WIRE 108 | WIRE 110 |
|---|---|---|---|
| SHIELD | 0 | 0 | 0 |
| STEP 1 | 1 | 1 | 1 |
| STEP 2 | 0 | 1 | 1 |
| STEP 3 | 0 | 0 | 1 |

900

902 GOOD

514 MAIN MENU

TEST RESULTS

| | WIRE 106 | WIRE 108 | WIRE 110 |
|---|---|---|---|
| SHIELD | 0 | 0 | 0 |
| STEP 1 | 1 | 1 | 1 |
| STEP 2 | 0 | 1 | 1 |
| STEP 3 | 0 | 1 | 1 |

1000

1002: 108 & 110 SHORTED AT STEP 3

514: MAIN MENU

FIG. 10

MK49 CABLE TESTER2

Program File List

| Name | Number | Type | Rungs | Debug | Bytes |
|---|---|---|---|---|---|
| [SYSTEM] | 0 | SYS | 0 | No | 0 |
|  | 1 | SYS | 0 | No | 0 |
| MAIN_PROG | 2 | LADDER | 14 | No | 120 |
| SEQUENCE | 3 | LADDER | 14 | No | 409 |
| INPUTS | 5 | LADDER | 5 | No | 171 |
| OUT CONTL | 6 | LADDER | 9 | No | 179 |
| AUTO TESTS | 7 | LADDER | 22 | No | 903 |
| MESSAGES | 8 | LADDER | 10 | No | 182 |
| MAN TESTS | 9 | LADDER | 8 | No | 277 |
| ANALOG | 10 | LADDER | 4 | No | 102 |
| COMPARE | 11 | LADDER | 14 | No | 315 |
| RECIPIE LD | 12 | LADDER | 12 | No | 1609 |
| CABLE SEL | 13 | LADDER | 15 | No | 982 |
| OUTPUTS | 15 | LADDER | 3 | No | 98 |
| SLIP LOGIC | 16 | LADDER | 15 | No | 671 |
| SLIP SEG | 17 | LADDER | 35 | No | 2153 |

PORTABLE MULTI-FUNCTION CABLE TESTER

CROSS REFERENCE TO RELATED APPLICATION

This non-provisional patent application claims the benefit of and priority from U.S. provisional patent application No. 61/973,319 filed Apr. 1, 2014, the disclosure of which is expressly incorporated herein by reference.

STATEMENT REGARDING FEDERALLY SPONSORED RESEARCH OR DEVELOPMENT

The invention described herein may be manufactured, used and licensed by or for the United States Government for any governmental purpose without payment of any royalties thereon. This invention (Navy Case 103,206) is assigned to the United States Government and is available for licensing for commercial purposes. Licensing and technical inquiries may be directed to the Technology Transfer Office, Naval Surface Warfare Center Crane, email: Cran_CTO@navy.mil.

FIELD OF THE DISCLOSURE

The disclosure relates generally to testing cable continuity, and more particularly, using a wire-configurable directional connector to test cable continuity.

BACKGROUND

Generally, testing cable continuity requires multiple users located at opposite ends of a cable under test to determine if there are any faults in the cable, such as open circuits, short circuits, or wires pinned incorrectly. Cables can be hundreds of feet in length and extend through multiple floors or rooms and may require long distance communication during testing, such as using hand-held radios. Communication during testing may be impeded by lack of radio connectivity, human error, and miscommunication between technicians resulting in faulty and potentially dangerous cable tests. There is a need to increase the speed and accuracy when testing cables and the ability to test cables with only a single technician.

BRIEF SUMMARY

The methods and system described herein are designed and configured to allow one user to test cable continuity using a wire-configurable directional connector. The wire-configurable directional connector includes a connection site configured to receive a plurality of wires of a cable under test at a second end of the cable under test, a plurality of connection wires configured to receive the plurality of wires from the connection site, at least a first diode configured to connect a selected first wire among the plurality of wires with a second wire among the plurality of wires of the cable under test, and at least a second diode configured to connect the second wire among the plurality of wires of the cable under test with a third wire among the plurality of wires of the cable under test.

The methods and system, illustratively utilizing a wire-specific voltage pulse generation main test unit, may transmit a first voltage pulse through a selected first wire among a plurality of wires of a cable under test, wherein the cable under test has a first end and the wire-configurable directional connector attached to a second end, and transmit a second voltage pulse through a selected second wire among the plurality of wires of the cable under test. In addition, the wire-specific voltage pulse generation main test unit may store a pre-determined pattern of at least one returning voltage pulse specific to the cable under test. A processor within the wire-specific voltage pulse generation main test unit transmits the first voltage pulse to selectively enter the first wire at the first end of the cable under test, travel through the wire-configurable directional connector attached to the second end, and selectively leave at least one of the second and third wires at the first end of the cable under test. The processor transmits the second voltage pulse to selectively enter the second wire at the first end of the cable under test, travel through the wire-configurable directional connector attached to the second end, and selectively leave the third wire. The wire-specific voltage pulse generation main test unit may further determine a state of the first, second, and third wires in response to receiving the first and second voltage pulses.

Cable tests that can be performed include, but are not limited to: cable shield integrity testing, which tests a cable shield continuity along the entire length of the cable under test, open circuit testing, which tests for open or broken circuits along the entire length of the cable under test, short circuit testing, which tests a cable under test along its entire length to find whether a wire within the cable under test is shorted to any other wire within that cable under test, and shorted to shield testing, which tests whether any wire within the cable under test is shorted to the shield.

According to an illustrative embodiment of the present disclosure, an apparatus for testing cable continuity, such as a wire-specific voltage pulse generation main test unit, includes a processor configured to transmit a first voltage pulse through a selected first wire among a plurality of wires of a cable under test, wherein the cable under test has a first end and a wire-configurable directional connector attached to a second end, and transmit a second voltage pulse through a selected second wire among the plurality of wires of the cable under test. The wire-specific voltage pulse generation main test unit further includes memory configured to store a pre-determined pattern of at least one returning voltage pulse specific to the cable under test. The wire-specific voltage pulse generation main test unit further includes an output module operatively connected to the processor and the first and second wires at the first end of the cable under test. The wire-specific voltage pulse generation main test unit further includes an input module operatively connected to the processor and the second wire and a third wire at the first end of the cable under test. The first voltage pulse is directed to selectively enter the first wire at the first end of the cable under test, travel through the wire-configurable directional connector attached to the second end, and selectively leave at least one of the second and third wires at the first end of the cable under test. The second voltage pulse is directed to selectively enter the second wire at the first end of the cable under test, travel through the wire-configurable directional connector attached to the second end, and selectively leave the third wire. The processor is configured to determine a state of the first, second, and third wires in response to receiving the first and second voltage pulses.

According to a further illustrative embodiment of the present disclosure, a method of assembly comprises fabricating a wire-configurable directional connector and fabricating a wire-specific voltage pulse generation main test unit Among other advantages, by using the methods and apparatus described herein, various capabilities for testing cable continuity may be improved, such as ease of use by reducing the confusion and time required when conducting tests on electronic cables, returning fully automated test results to the user through a digital display, requiring little or no technical expertise by the user operating the apparatus, and increased trouble shooting speed. Other advantages will be recognized by those of ordinary skill in the art.

BRIEF DESCRIPTION OF THE DRAWINGS

FIG. 9 shows a block diagram illustrating another example of an illustrative operator interface of an illustrative faceplate.

FIG. 10 shows a block diagram illustrating another example of an illustrative operator interface of an illustrative faceplate.

FIG. 16 shows an example of several subroutines executed by an illustrative wire-specific voltage pulse generation main test unit.

DETAILED DESCRIPTION OF THE PREFERRED EMBODIMENTS

Figure 1:
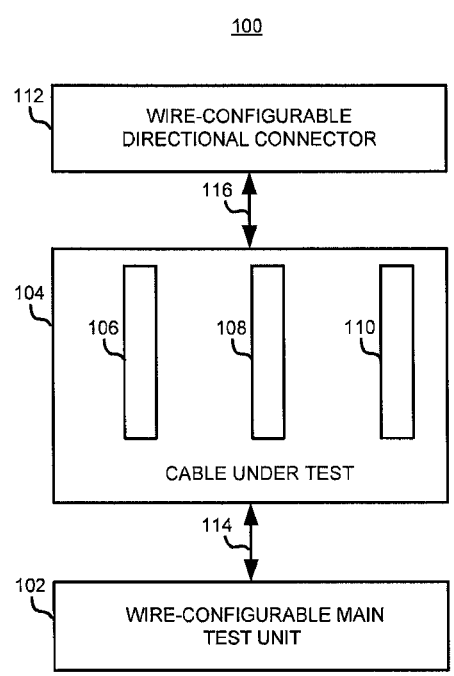
FIG. 1 shows a block diagram illustrating one example of an illustrative system using an illustrative wire-specific voltage pulse generation main test unit and an illustrative wire-configurable directional connector.

FIG. 1 shows a block diagram illustrating one example of a system 100 employing an apparatus 102, such as a wire-specific voltage pulse generation main test unit (MTU 102), a cable under test 104, and a wire-configurable directional connector 112. In this example, the cable under test 104 comprises a first wire, a second wire, and a third wire, such as wire 106, wire 108, and wire 110, respectively. Those of ordinary skill in the art will recognize that the cable under test 104 may comprise any number of wires.

MTU 102 may be supported by a chassis and stored in a protective case, such as a pelican case, that allows for protection from shock and environmental hazards. Further, MTU 102 may be powered by either an external power source directly attached to the MTU 102 or by using a permanent power source, such as a ship power or a wall outlet, by connecting a power cable from the permanent power source to the MTU 102 via a power input connector. The external power source can be used instead of the permanent power source to provide a user with the ability to use the MTU 102 away from the permanent power source or when the permanent power source is unavailable.

The wire-configurable directional connector 112 may be comprised of multiple one-way jumpers or diodes, which allow voltage pulses that are transmitted by the MTU 102 to return to the MTU 102 in certain pre-determined patterns. For example, wires 106, 108, and 110 in the cable under test 104 are pulsed independently by the MTU 102 and the pattern of returning pulses are then compared to a pre-determined pattern list that is specific to the cable under test 104. If a diode connects wires 106 and 108, and another diode connects wires 108 and 110, a voltage pulse may be directed to selectively enter wire 106 at the first end of the cable under test 104, travel through the wire-configurable directional connector 112 attached to the second end of the cable under test 104, and selectively leave wire 108 at the first end of the cable under test 104. Another voltage pulse may be directed to selectively enter wire 108 at the first end of the cable under test 104, travel through the wire-configurable directional connector 112 attached to the second end of the cable under test 104, and selectively leave wire 110. An analysis of these patterns of returning voltages at the first end of the cable under test 104 by the MTU 102 can then be used to determine certain faults in the cable under test 104 if any.

Different cables for testing may have different pre-determined pattern lists. Accordingly, the wire-configurable directional connector 112 is specifically designed for one cable under test to provide the pre-determined pattern list consistently upon each test. In this example, wire-configurable directional connector 112 is specially designed for the cable under test 104. Thus, each cable under test generally requires its own corresponding wire-configurable directional connector, unless the internal wiring of one cable under test is substantially similar to that of another cable under test.

The MTU 102 is coupled to the cable under test 104 via communication link 114. The cable under test 104 is coupled to the wire-configurable directional connector 112 via communication link 116.

Figure 2:
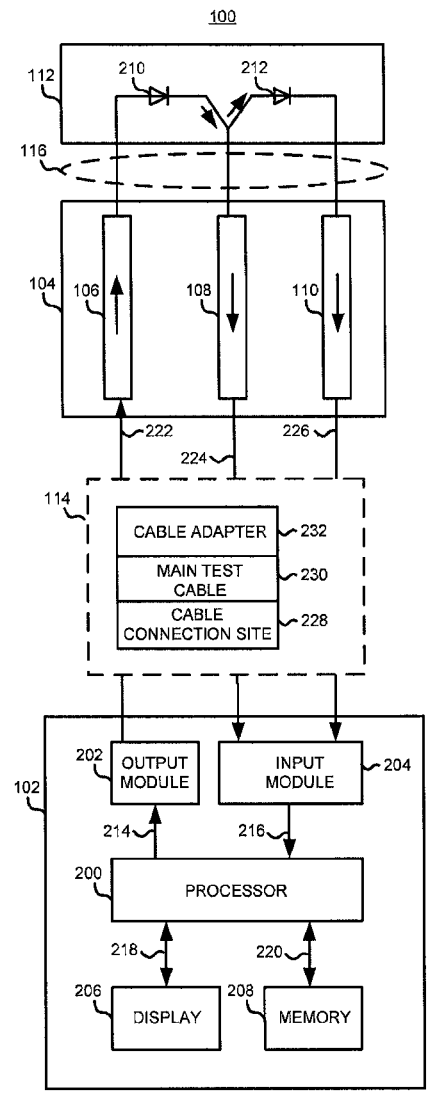
FIG. 2 shows a block diagram illustrating another example of an illustrative system using an illustrative wire-specific voltage pulse generation main test unit and an illustrative wire-configurable directional connector.

FIG. 2 shows a block diagram illustrating one example of the system 100 employing the MTU 102, the cable under test 104, and the wire-configurable directional connector 112. In this example, the MTU 102 comprises a processor 200, an output module 202, an input module 204, a display 206, and memory 208. Although the memory 208 is shown in as separate from the processor 200, it may be a part of the processor 200.

The processor 200 may include one or more processors that may be a host central processing unit (CPU) having one or multiple cores, a general processor such as an accelerated processing unit (APU), or any other suitable processor. An example is the Allen Bradley Micrologix 1100 Processor w/(10) 24 VDC inputs and (4) DC outputs. The processor 200 may operate in combination with any suitable executing software module, hardware, or executing firmware. The processor 200 may communicate with memory 208 via communication link 220 to execute instructions stored in memory 208 to send out a voltage pulse, such as a voltage of direct current (VDC) signal, via the output module 202, such as a voltage generator. For example, the instructions may be a bit sequence, such as "111," in which upon receipt, the output module 202 may send three voltage pulses individually to wires 106-110, respectively, where a bit "1" reflects high voltage, and a bit "0" reflects low voltage. Memory 208 may be include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

The memory 208 may contain preprogrammed test sequences for a plurality of different cables to be tested, and may also be programmable for additional or removal of other cables for testing. The memory 208 may also contain the pre-determined pattern list provided by the wire-configurable directional connector 112. For example, the test sequences may be associated with the pre-determined pattern list and may specify the number of voltage pulses, the voltage level of the voltage pulses, and the likes. The voltage pulse is returned via the input module 204, such as a voltage comparator, and communicated back to the processor 200 via communication link 216.

The input module 204 compares the returned voltage pulse with its associated voltage threshold. For example, if the returned voltage pulse is a 24 VDC signal and its associated voltage threshold is 10V, the input module 204 compares the 24 VDC signal and its associated voltage threshold. Since the 24 VDC signal is greater than the voltage threshold of 10V, the input module 204 may communicate back to the processor 200 that a return voltage pulse was properly received, which may be represented as a bit "1." The MTU 102 may use a 24 VDC power source with a 2 amperage (A) current rating, but other ratings are contemplated to meet different needs.

Because the cable under test 104 may comprise a plurality of wires, a plurality of voltage pulses needs to be generated. The process 200 may send a voltage pulse through the output module 202, where the voltage pulse is passed through a voltage divider and an at least one DC voltage isolation relay through a test pulse current limiter to provide the plurality of voltage pulses.

The display 206 is coupled to the processor 200 via communication link 218 to display an operator interface and test results. Accordingly, the communication link 218 allows transfer of information from the processor 200 to the display 206 for display and user inputs from the display 206 to the processor 200 to control various cable tests. The communication links 214, 216, 218, and 220 may be buses, ribbon cables, or any other suitable links.

When the MTU 102 transmits a voltage pulse via the output module 202, the voltage pulse is transmitted to a specific wire, such as wire 106, as shown by arrow 222. The voltage pulse leaves the wire 106 and is transmitted to a diode 210 within the wire-configurable directional connector 112 via communication link 116. The diode 210 couples wire 106 with another specific wire, such as wire 108. Because wire 108 is also coupled to wire 110 by another diode 212, the voltage pulse is transmitted and returned to the MTU 102 via the input module 204 on wires 108 and 110 due to forward bias of diodes 210 and 212, as shown by arrows 224 and 226. Accordingly, the voltage pulse that originated from a specific wire, namely wire 106, is returned on another specific wire or a group of specific wires, namely wires 108 and 110. If the voltage pulse had originally been transmitted to a different specific wire, such as wire 108 instead of wire 106, due to reverse bias of diode 210, the voltage pulse would not have been transmitted and returned to the MTU 102 on wire 106. However, the voltage pulse would still have been transmitted to wire 110 due to forward bias of diode 212.

The processor 200 subsequently determines a state of the wires 106-110 in response to receiving voltage pulses returned from wires 108 and 110 by comparing the voltage pulses that leaves wires 108 and 110 from the first end of the cable under test 104 with the pre-determined pattern list in memory 208 associated with both the cable under test 104 and the wire-configurable directional connector 112. For example, voltage pulses that leave wires 108 and 110 from the first end of the cable under test 104 may be in the form of an actual bit file. The actual bit file contains a bit sequence indicative of the actual continuity between the cable under test 104 and the wire-configurable directional connector 112. For instance, if voltage pulses are present from wires 108 and 110, the bit sequence may be "11."

In addition, the pre-determined pattern list in memory 208 may be a master bit file prepopulated with data pertinent to a plurality of cables for testing, including the cable under test 104, and a plurality of associated wire-configurable directional connectors, including the wire-configurable directional connector 112. A knowledgeable user concerning proper operation of the plurality of cables for testing and the plurality of wire-configurable directional connectors may populate the master bit file for provisioning into memory 208. The master bit file contains a plurality of bit sequences indicative of proper continuity between the cable under test 104 and the wire-configurable directional connector 112. The knowledgeable user may be the user testing the cable, or may be a manufacturer of at least one of the plurality of cables for testing and the plurality of wire-configurable directional connectors. For example, if the interaction between the cable under test 104 and wire-configurable directional connector 112 allows for return voltage pulses on wires 106-110, the master bit file may include a bit sequence of "111."

The processor 200 is configured to retrieve both the actual bit file and the master bit file from memory 208 to compare both files. If the processor 200 determines that the actual bit file and the master bit file are equivalent, the processor 200 is able to provide a reading to the user that the cable under test 104 is "good," or a cable with proper continuity. If the actual bit file and the master bit file are determined to be different, the processor 200 is able to provide a reading to the user that the cable under test 104 contains a fault.

Executable instructions stored in memory 208 executed by the processor 200 can be used to transmit a voltage pulse and compare the voltage pulse with the pre-determined pattern list to determine a state of the wires in response to the comparison. The instructions can refer to profiles associated with each cable under test, where each profile comprises various information, such as the corresponding wire-configurable directional connector for the cable under test, the number of wires that comprise the cable under test, the configuration of the pattern list, and the likes.

The communication link 114 may comprise a cable connection site 228 attached to the MTU 102, a main test cable 230, and a cable adapter 232. The main test cable 230 may be a universal cable that is configured to be operatively coupled to the cable adapter 232. The cable adapter 232 may be adapted for each cable under test 104. MTU 102 may connect to a first end of the main test cable 230 at the cable connection site 228. A second end of the main test cable 230 may be configured to connect to a first end of the cable adapter 232. A second end of the cable adapter 232 may be configured to connect to the cable under test 104. The communication link 116 may comprise a connection site designed to mate with the specified cable under test 104. Advantages of using the main test cable and the cable adapter allow the user to merely interchange other adapters that fit the cable under test. However, other communication links are contemplated. For instance, the cable under test 104 may directly be coupled to the MTU 104. Advantages include not requiring the main test cable and adapter cable.

Figure 3:
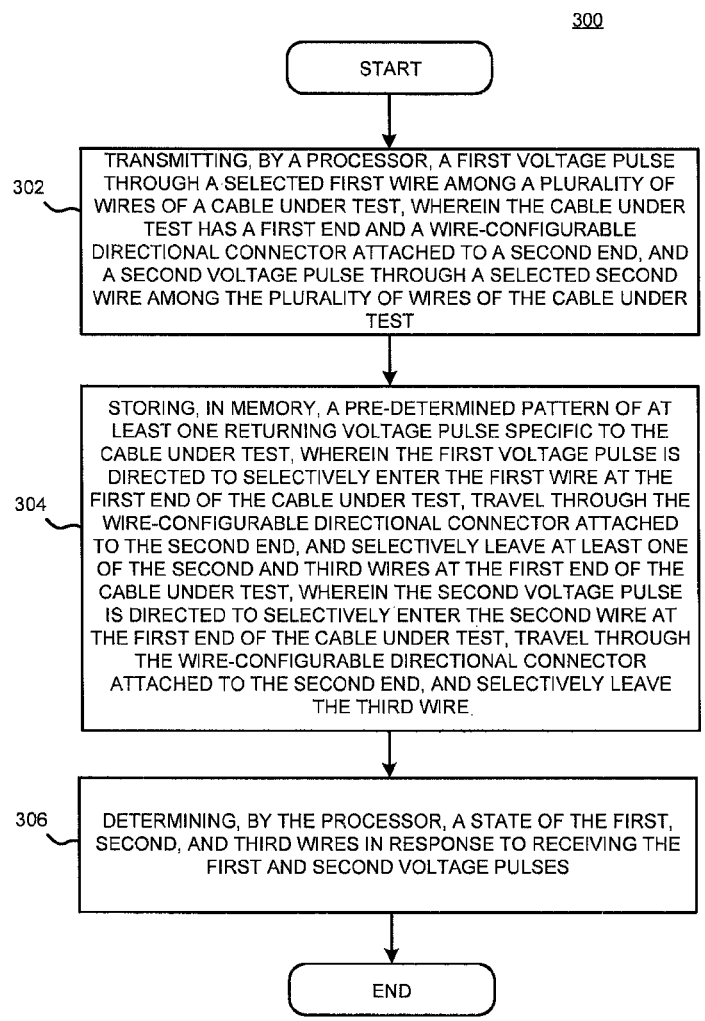
FIG. 3 shows a flowchart generally illustrating an example of a method of testing cable continuity using an illustrative wire-specific voltage pulse generation main test unit and an illustrative wire-configurable directional connector.

FIG. 3 shows a flowchart generally illustrating an example of a method 300 of testing cable continuity using the MTU 102. Particularly, FIG. 3 may be performed by the processor 200 of FIG. 2. As shown in block 302, the method 300 includes transmitting a first voltage pulse through the selected first wire 106 among a plurality of wires 106, 108, and 110 of the cable under test 104, wherein the cable under test 104 has a first end and the wire-configurable directional connector 112 attached to a second end, and transmitting a second voltage pulse through the selected second wire 108 among the plurality of wires 106, 108, and 110 of the cable under test 104. As shown in block 304, the method 300 includes storing, in memory 208, a pre-determined pattern of at least one returning voltage pulse specific to the cable under test 104, wherein the first voltage pulse is directed to selectively enter the first wire 106 at the first end of the cable under test 104, travel through the wire-configurable directional connector 112 attached to the second end, and selectively leave at least one of the second wire 108 and third wire 110 at the first end of the cable under test 104, and wherein the second voltage pulse is directed to selectively enter the second wire 108 at the first end of the cable under test 104, travel through the wire-configurable directional connector 112 attached to the second end of the cable under test 104, and selectively leave the third wire 110. As shown in block 306, the method 300 includes determining a state of the wires 106-110 in response to receiving the first and second voltage pulses. The state may describe the cable shield integrity, any potential open circuit, any potential short circuit, or any potential short circuit to shield.

Figure 4:
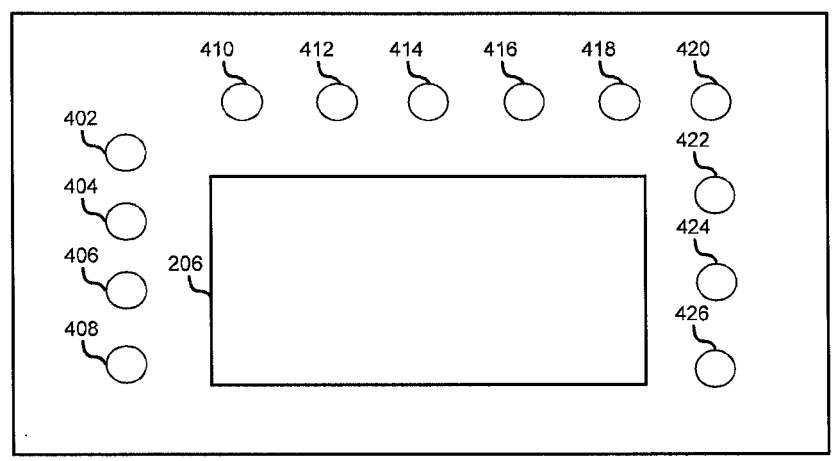
FIG. 4 shows a block diagram illustrating an example of an illustrative faceplate of an illustrative wire-specific voltage pulse generation main test unit.

FIG. 4 shows a block diagram illustrating an example of a faceplate 400 of the apparatus 100. The faceplate 400 encompasses the MTU 102 and is connected to the chassis through suitable communication links such as ribbon cables. In this example, the faceplate 400 comprises the display 206, and a plurality of various controls and indicators designated as 402-426. Although various controls and indicators designated as 402-424 are depicted below, those of ordinary skill in the art will appreciate any variations of the configuration described below.

The display 206 displays an operator interface, which may include touch screen capabilities, to control the processor 200 and to display test results for the user. Indicator 402 is a power indicator light-emitting diode (LED) that illuminates to indicate that a power input, such as from an external power source or a permanent power source, is provided to the MTU 102 at a power input receiver 404. For example, the external power source may be attached to the MTU 102 by inserting an external power source cable coupled to the external power source into the power input receiver 404. When external power is being supplied, a dedicated LED 406 illuminates. When permanent power is being supplied, a dedicated LED 408 illuminates.

A main power switch 410 turns the MTU 102 on and off. A reverse polarity indicator 412 is a different colored LED that indicates whether the correct polarity of the power input is provided to the MTU 102. For example, if the polarity of the power input is incorrect, the reverse polarity indicator 412 may illuminate to provide the user a warning to disconnect power and address the problem.

The MTU 102 may further require specific pre-determined amperage. To ensure that the MTU 102 is receiving the proper pre-determined amperage, an amperage fuse 414 is located on the faceplate 400 that will restrict the amperage to the MTU 102.

Indicators 416, 418, and 420 are power indicator LEDs that illuminate to indicate which wires of the cable under test 104, such as wires 106, 108, and 110, are supplied with voltage pulses. Manual increase 422 and manual decrease 424 buttons allow the user to manually apply a voltage pulse to the individual wires 106, 108, and 110 during the test. A fault buzzer 426 indicates to the user that a fault was discovered during the test in order to supply an audible warning to the user in addition to visual indications.

FIGS. 5-11 illustrate various examples of what may be displayed on the operator interface via the display 206. The sequence of examples depicts one example in which the user may use the operator interface. Those of ordinary skill in the art will understand that the sequence can be programmed to meet the needs of the test to be performed.

Figure 5:
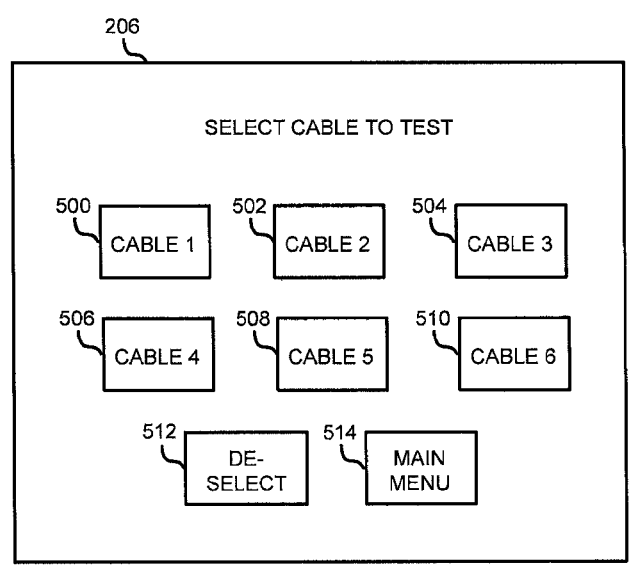
FIG. 5 shows a block diagram illustrating one example of an illustrative operator interface of an illustrative faceplate.

In FIG. 5, the user is presented with screen icons 500-510 to select which cable to be tested. In this example, the MTU 102 is already programmed to test for cables 1-6 as depicted by the screen icons 500-510, respectively. For example, cable 1 may be cable under test 104. The user can also be given the opportunity to de-select the selected cable under test 104 by pressing screen icon 512 or return to the main menu by pressing screen icon 514.

Figure 6:
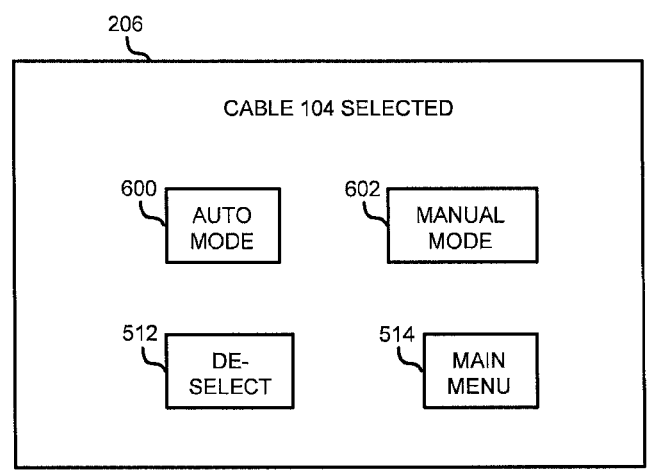
FIG. 6 shows a block diagram illustrating another example of an illustrative operator interface of an illustrative faceplate.

The user is brought to the screen shown in FIG. 6 after the user has indicated the specified cable under test 104 and appropriately having pressed screen icon 500. In FIG. 6, the user is presented with screen icons 600 and 602 to select which mode, either automatic mode or manual mode, respectively, to test the selected cable under test 104. The automatic mode automatically tests all individual wires, whereas the manual mode requests a specified wire to test from the user. As in FIG. 5, the user is given the opportunity to de-select the selected cable under test 104 by pressing screen icon 512 or return to the main menu by pressing screen icon 514.

Figure 7:
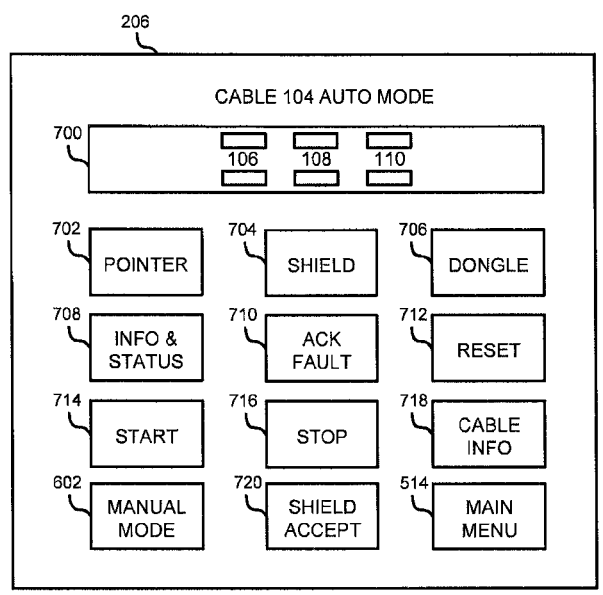
FIG. 7 shows a block diagram illustrating another example of an illustrative operator interface of an illustrative faceplate.

The user is brought to the screen shown in FIG. 7 after the user has desired for an automatic mode test and appropriately having pressed screen icon 600. A wire-configurable directional connector icon 706 will be displayed to indicate which wire-configurable directional connector, such as the wire-configurable directional connector 112, is connected to the cable under test 104 and may provide identification information such as the serial number of the wire-configurable directional connector. A wire icon 700 depicting the individual wires of the cable under test 104 is displayed indicating all wires associated with the cable under test 104. The individual wires are each associated with a colored top bar indicating that the MTU 102 is sending a voltage pulse through a designated wire and a colored bottom bar indicating that there is a returning voltage pulse from another designated wire. A shield indicator icon 704 illuminates when voltage is detected on the cable shield indicating a live reading which would be a fault in the cable under test 104 and requires follow up action by the user. A shield accept icon 720 illuminates if the automatic test has determined that the shield of the cable under test 104 is intact and there are no faults related to the cable under test 104. A sequence pointer icon 702 is displayed to denote which wire is being tested at a particular moment in time. An info & status icon 708 can be touched to display instructions for the user and display a test status while the test is in progress. A cable info icon 718 when touched displays information relative to the cable under test 104, such as the particular model, serial number, whether any adapters are needed, and the likes. As in FIG. 5, the screen icon 514 will return the user to the main menu.

A start icon 714 and stop icon 716 can be touched to start and stop the automatic test. The user may select a reset icon 712 to reset the test and return to the start of the test. The user can toggle to the manual mode by touching the screen icon 602. To continue an automatic test after the MTU 102 has encountered a test fault, the user can touch an Ack Fault icon 710.

Figure 8:
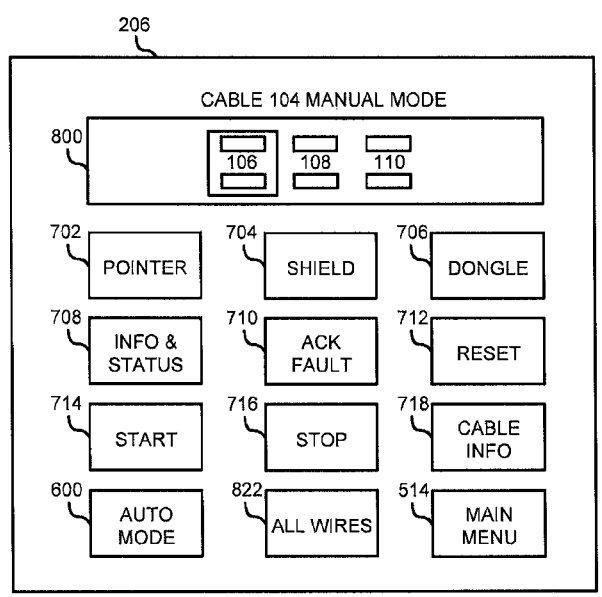
FIG. 8 shows a block diagram illustrating another example of an illustrative operator interface of an illustrative faceplate.

The user is brought to the screen shown in FIG. 8 after the user has desired for a manual mode test and appropriately having pressed screen icon 602 depicted in FIG. 6. A wire icon 800 depicting the individual wires of the cable under test 104 is displayed indicating both the selected wire in which the user desires to send a voltage pulse to and all wires associated with the cable under test 104. The individual wires are each associated with a colored top bar indicating that the MTU 102 is sending a voltage pulse through a designated wire and a colored bottom bar indicating that there is a returning voltage pulse from another designated wire. The voltage pulse, such as a 24 VDC signal, will be applied to the selected wire. The applied voltage and current amp draw may also be displayed on the operator interface, such as in the display associate with the info & status icon 708.

Similar to FIG. 7, the wire-configurable directional connector icon 706 will be displayed to indicate which wire-configurable directional connector is connected to the cable under test 104 and may provide information such as the serial number of the wire-configurable directional connector. For example, if the cable under test 104 has an associated wire-configurable directional connector 112, the wire-configurable directional connector icon 706 would display information pertinent to wire-configurable directional connector 112. The shield indicator icon 704 illuminates when voltage is detected on the cable shield indicating a live reading which would be a fault in the cable under test 104 and requires follow up action by the user. The sequence pointer icon 702 is displayed to denote which wire is being tested at a particular moment in time. In this example, sequence pointer icon 702 shows wire 106 as the wire being tested currently. The sequence pointer icon 702 can also display a colored bar on the top of the icon indicating that the MTU 102 is sending the voltage pulse through the designated wire and a colored bar on the bottom of the icon indicating that there is a return voltage pulse returning from the designated wire. Individual wires to be tested can be cycled through manually by depressing the manual increase 422 and manual decrease 424 buttons as depicted in FIG. 4. Touching the all wires icon 822 will allow the user to advance through all wires in a pre-determined sequence.

An info & status icon 708 can be touched to display instructions for the user and display a test status while the test is in progress. The cable info icon 718 when touched displays information relative to the cable under test 104, such as the particular model, serial number, whether any adapters are needed, and the likes. As in FIG. 5, the screen icon 514 will return the user to the main menu.

The start icon 714 and stop icon 716 can be touched to start and stop the manual test. Specifically, the start icon 714 and stop icon 716 start or stop sending power through the designated wire for testing. The user may select the reset icon 712 to reset the test and return to the start of the test. The user can toggle to the automatic mode by touching the auto mode icon 602. To continue an automatic test after the MTU 102 has encountered a test fault, the user can touch the Ack fault icon 710.

The user is brought to the screen shown in FIG. 9 after the user has desired for either a manual or automatic testing of wires 106-110, respectively. FIG. 9 describes a detailed table 900 displaying the results of the test per wire, a summary table 902 displaying the overall conclusion based on the results of the test per wire, and the screen icon 514 to return to the main menu upon selection. The table 900 represents an example of the actual bit file. In this example, a shield test may be preliminarily performed. A voltage pulse may be applied to the shield of the cable under test 104. If the wire-configurable directional connector 112 is wired to couple the shield to each of the wires 106-110, and if the voltage pulse returns individually from the wires 106-110, the shield associated with the wires 106-110 has proper continuity at each end of the cable under test 104. Bit 0 across the wires 106-110 denotes the shield associated with the cable under test 104 having proper continuity. If the shield is not properly connected, the test sequence is halted and an audible alarm may sound to let the user know of a faulty shield. The user has the choice of acknowledging the fault and continuing with testing or aborting the test.

After a properly connected shield is determined, tests can be run to determine if any of the wires of the cable under test 104 are shorted to the shield. The results of the detailed table 900 are associated with the configuration of the apparatus 100 of FIG. 2. For example, the voltage pulse is transmitted to wire 106. If the cable under test 104 does not comprise of any wires shorted to the shield, wire 108 and wire 110 also receive the voltage pulse due to the forward bias of diodes 210 and 212. The presence of a voltage pulse on each wire is denoted by bit 1 across all wires in step 1 of the detailed table 900. Next, as denoted in step 2, when the voltage pulse is transmitted to wire 108, wire 110 also receives the voltage pulse due to the forward bias of diode 212. However, wire 106 does not receive the voltage pulse due to the reverse bias of diode 210. The lack of a presence of a voltage pulse on wire 106 is denoted by bit 0 of the detailed table 900. Lastly, as denoted in step 3, when the voltage pulse is transmitted to wire 110, wire 106 and wire 108 do not receive the voltage pulse due to the reverse bias of diodes 210 and 212. The lack of a presence of a voltage pulse on wire 106 and wire 108 is denoted by bit 0 of the detailed table 900. Because the cable under test 104 does not comprise of any wires shorted to each other, the summary table 902 may display an indicator such as "GOOD," indicating that the cable under test 104 is free of any short circuits. Accordingly, the processor 200 determines that the actual bit file and the master bit file are equivalent in this example.

Similarly, FIG. 10 describes an example of the cable under test 104 that comprises a short circuit. For example, the voltage pulse is transmitted to wire 106. Wire 108 and wire 110 also receive the voltage pulse due to the forward bias of diodes 210 and 212. The presence of a voltage pulse on each wire is denoted by bit 1 across all wires in step 1 of the detailed table 1000. The table 100 represents an example of the actual bit file. Next, as denoted in step 2, when the voltage pulse is transmitted to wire 108, wire 110 also receives the voltage pulse due to the forward bias of diode 212. However, wire 106 does not receive the voltage pulse due to the reverse bias of diode 210. The lack of a presence of a voltage pulse on wire 106 is denoted by bit 0 of the detailed table 1000. Lastly, as denoted in step 3, when the voltage pulse is transmitted to wire 110, both wire 106 and wire 108 should not receive the voltage pulse due to the reverse bias of diodes 210 and 212 if either of wire 106 and wire 108 are not shorted to wire 110. However, because wire 108 is shorted to wire 110, the presence of a voltage pulse on wire 10 is denoted by bit 1 of the detailed table 1000. Because the cable under test 104 comprises a short circuit, the summary table 1002 may display an indicator such as "108 & 110 SHORTED AT STEP 3," indicating that the cable under test 104 includes a short circuit. Accordingly, the processor 200 determines that the actual bit file and the master bit file are not equivalent in this example. The user may then identify that the problem with the cable under test 104 is limited to wire 108 shorted to wire 110.

Figure 11:
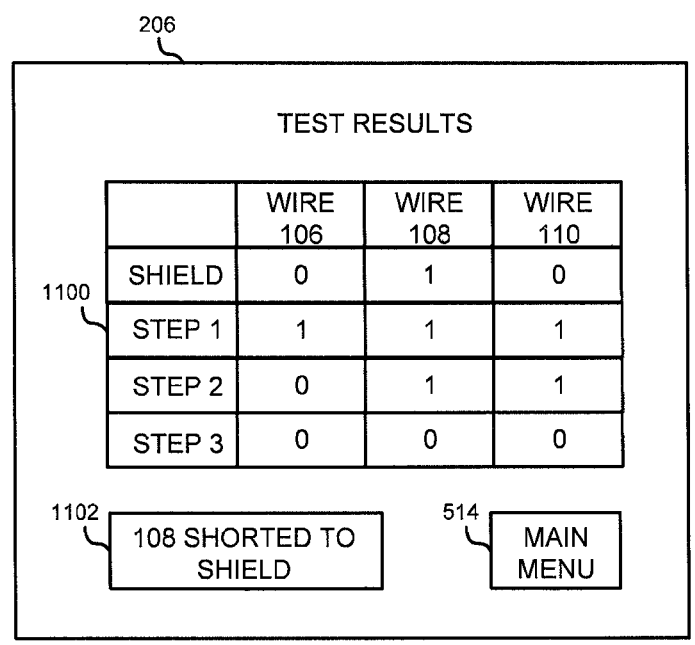
FIG. 11 shows a block diagram illustrating another example of an illustrative operator interface of an illustrative faceplate.

FIG. 11 describes an example of the cable under test 104 that comprises a short to shield. In this example, a shield test is performed. A voltage pulse may be applied to the shield of the cable under test 104. If the wire-configurable directional connector 112 is wired to couple the shield to each of the wires 106-110, and if the voltage pulse returns individually from the wires 106-110, the shield associated with the wire 106 has proper continuity at each end of the cable under test 104. Bit 0 across the wire 106 and wire 110 denotes the shield associated with the cable under test 104 having proper continuity. However, bit 1 across the wire 108 denotes wire 108 shorted to the shield. As can be seen from the detailed table 1100, which represents an example of the actual bit file, had the shield test not have been preliminary performed, a short to shield may not have been detected. Because the cable under test 104 comprises a short to shield, the summary table 1102 may display an indicator such as "108 SHORTED TO SHIELD," indicating that the cable under test 104 includes a short to shield. Accordingly, the processor 200 determines that the actual bit file and the master bit file are not equivalent in this example. The user may then identify that the problem with the cable under test 104 is limited to wire 108.

Figure 12:
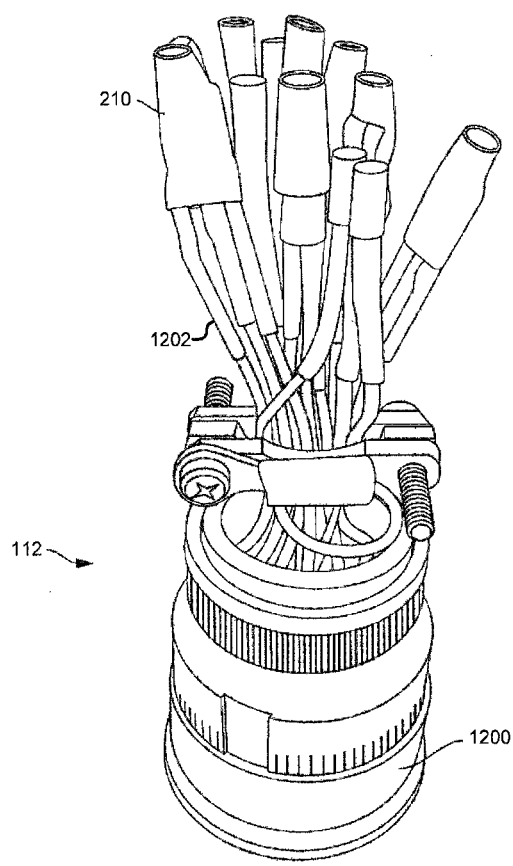
FIG. 12 shows a block diagram illustrating one example of an illustrative wire-configurable directional connector.

FIG. 12 shows a block diagram illustrating one example of the wire-configurable directional connector 112. The wire-configurable directional connector 112 includes a connection site 1200 configured to receive the plurality of wires, such as wires 106-110, at the second end of the cable under test 104. Specifically, a plurality of connection wires 1202, which may be exposed, are configured to receive the plurality of wires from the connection site 1200. At least one diode, such as diode 210 or diode 212, is configured to connect a selected first wire among the plurality of wires with a second wire among the plurality of wires of the cable under test 104. The diode facilitates transmittal of a voltage pulse from the selected first wire to the second wire at the second end of the cable under test 104. The connection site 1200 is fabricated to meet specifications of a particular cable under test.

Figure 13:
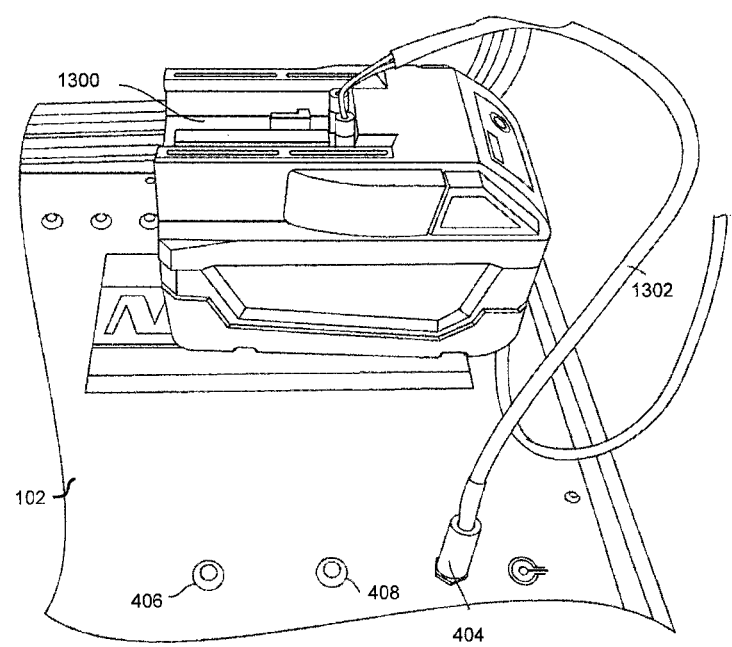
FIG. 13 shows a block diagram illustrating one example of an illustrative external power source.

FIG. 13 shows a block diagram illustrating one example of an external power source 1300. The external power source 1300 is directly attached to the MTU 102 by inserting an external power source cable 1302 into the power input receiver 404. When external power is being supplied, a dedicated LED 406 illuminates. When permanent power is being supplied, a dedicated LED 408 illuminates. The external power source 1300 may be a 24 VDC power source with a 2 A current rating, but other ratings are contemplated to meet different needs.

Figure 14:
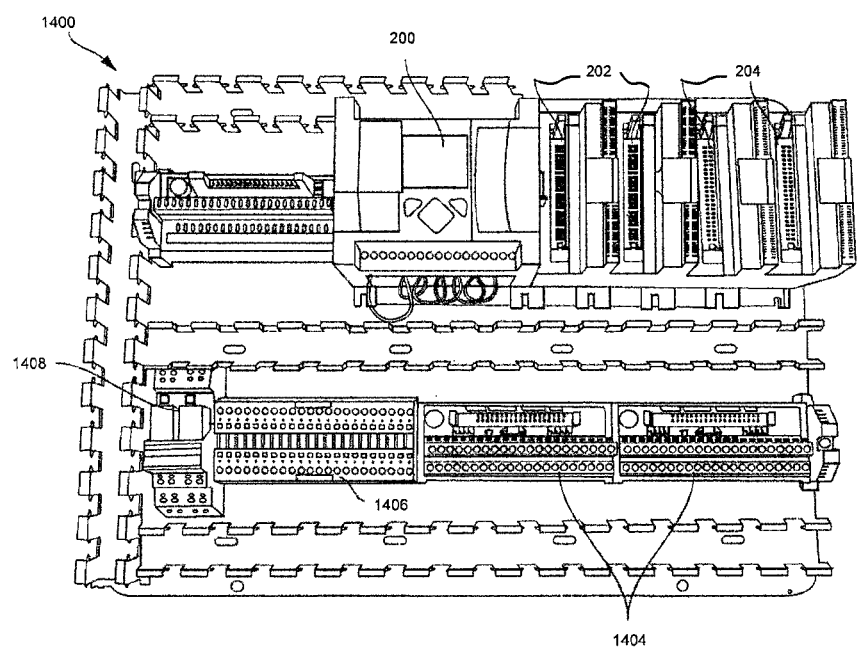
FIG. 14 shows a block diagram illustrating one example of an illustrative component layout of an illustrative chassis.

FIG. 14 shows a block diagram illustrating one example of a component layout of a chassis. Chassis 1400 may be designed such that it is contained within a protective case and located under and connected to the faceplate 400. Chassis 1400 includes the processor 200. The processor 200 is operatively connected to the output module 202 and the input module 204. The processor 200 sends the voltage pulse through the output module 202 through ribbon cables to a plurality of ribbon cable terminal blocks 1404 where the applied system voltage is passed through a voltage divider 1406 to monitor the applied system voltage level. The voltage pulse travels through a pre-determined wire in the cable under test 104 to the wire-configurable directional connector 112 and back through the cable under test 104 on a different pre-determined wire. The pre-determined voltage pulse is then relayed through the input module 204. The voltage pulse is then directed to the processor 200 for analysis. Isolation relays 1408 insure the applied external power source 1300 is of the correct polarity.

Figure 15:
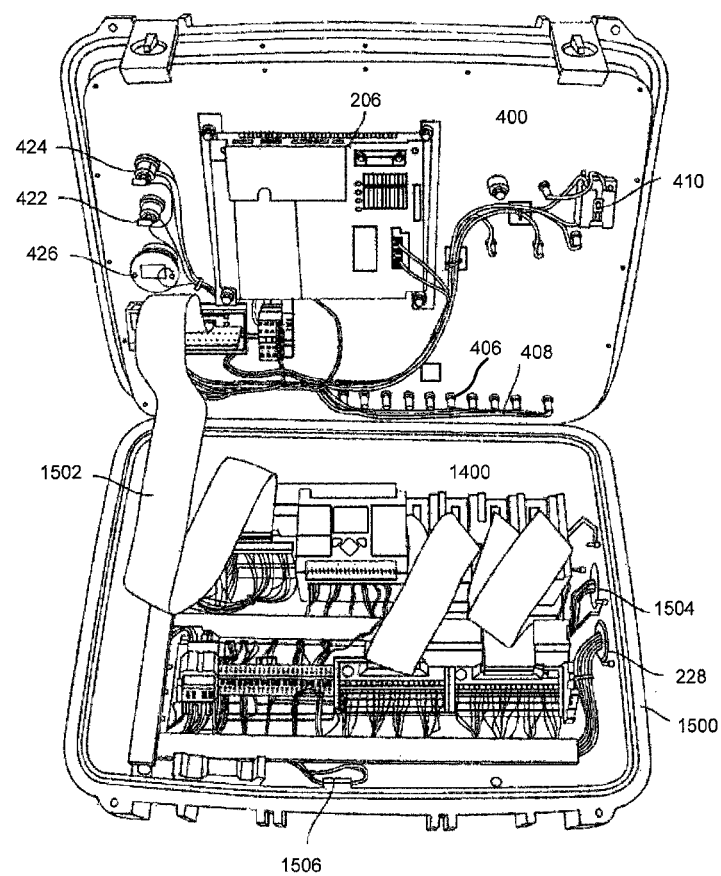
FIG. 15 shows a block diagram of an illustrative chassis and an illustrative underside of an illustrative faceplate.

FIG. 15 shows a block diagram of the chassis 1400 and the underside of the faceplate 400. The chassis 1400 and the faceplate 400 are configured to fit within the protective case 1500. The faceplate 400 and the chassis 1400 are connected through a ribbon cable 1502 which transfers information from the processor 200 to the operator interface via display 206 and user inputs from the operator interface to the processor 200 to control the various preprogrammed cable tests. Manual increase 422 and manual decrease 424 buttons are located on the faceplate 400, both of which allow the user to manually apply a voltage pulse to the individual wires 106, 108, and 110 during the test. A fault buzzer 426 is located on the faceplate 400 and is used to indicate to the user that a fault was discovered during the test in order to supply an audible warning to the user in addition to visual indications. The main power switch 410 on the faceplate 400 can be used to turn an MTU 102 on and off. Depending on the type of power supplied, either a dedicated LED 406 or dedicated LED 408, both on the faceplate 400, may illuminate. The chassis 1400 also includes a power input connector 1504 to receive a power cable from the power source. The cable connection site 228 located on the chassis 1400 may receive the main test cable 230. The test pulse current limiter 1506 is also shown on the chassis 1400.

FIG. 16 shows an example of several subroutines executed by an illustrative apparatus. When a user for example presses the start icon 714 to start an automatic test, the processor 200 loads up all the subroutines via subroutine 2, which is indicated as "MAIN_PROG." Subroutine 3 indicated as "SEQUENCE" is executed by the processor 200 of the MTU 102. The counter indicated as "C5:0" in the appendix indicates the number of wires of the cable under test. The subroutine 3 is configured to allow the output module 202 to send out a voltage pulse, for example on wire 106, if the counter indicates a value of "1." Further, the subroutine 3 is configured to send out a voltage pulse, for example on wire 108, if the counter indicates a value of "2." The output module 202 may execute a subroutine 6 in order to sequentially transmit a first voltage pulse through a selected first wire and then a second voltage pulse through a selected second wire among the plurality of wires of the cable under test 104. In addition, after the user has selected the cable under test, the MTU 102, particularly processor 200 may execute a subroutine 12, indicated as "RECIPIE LD" to provision a master bit file indicative of proper continuity between the cable under test and the wire-configurable directional connector into the memory 208. Subroutine 5 indicated as "INPUTS" is executed by the processor 200 and the input module 202 of the MTU 102. The destination register indicated as "Dest" is used to represent the returned voltage pulses, as shown in the appendix. Although "Dest" is presented as zero signifying no returned voltage pulses for all positions of register "B," non-zero values signify returned voltages. The processor 200 may execute subroutine 8, which is indicated as "MESSAGES," in conjunction with the display 206, to display test results. Although the subroutines are presented in a specified order for illustration purposes, the order of the subroutines may vary. In addition, one of ordinary skill in the art may view the attached appendix to understand further details of the operation concerning the MTU 102. The appendix is incorporated by reference herein.

Among other advantages, by using the methods and apparatus described herein, various capabilities for testing cable continuity may be improved, such as ease of use by reducing the confusion and time required when conducting tests on electronic cables, returning fully automated test results to the user through a digital display, requiring little or no technical expertise by the user operating the system, and increased trouble shooting speed. Other advantages will be recognized by those of ordinary skill in the art.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims. Other embodiments may be utilized, and other changes may be made, without departing from the spirit or scope of the subject matter presented herein. It will be readily understood that the aspects of the present disclosure, as generally described herein and illustrated in the figures, can be arranged, substituted, combined, separated, and designed in a wide variety of different configurations, all of which are contemplated herein.

What is claimed is:

1. A method of assembly, comprising:
    fabricating a wire-configurable directional connector to couple with a plurality of wires at a second end of a cable under test comprising a first wire, a second wire, and a third wire; and
    fabricating a wire-specific voltage pulse generation main test unit to generate:
        a first voltage pulse to selectively enter the first wire of a first end of the cable under test, travel through the wire-configurable directional connector attached to the second end, and selectively leave at least one of the second wire and the third wire at the first end of the cable under test; and
        a second voltage pulse to selectively enter the second wire at the first end of the cable under test, travel through the wire-configurable directional connector attached to the second end, and selectively leave the third wire at the first end of the cable under test;
    wherein fabricating the wire-configurable directional connector further comprises:
        providing a plurality of diodes comprising a first and second diode each with first and second connector, at least the first and second diodes are adapted to only allow current to pass from each second connector of at least the first and second diodes;
        providing a plurality of conductive path structures comprising a first, second, and third conductive path structure;
        providing a connection interface section that is formed to selectively and respectively couple and electrically interface the plurality of wires comprising at least the first, second and third wires with the plurality of conductive path structures comprising at least the first, second, and third conductive path structures;
        connecting the first conductive path structure with the first connector of the first diode;
        connecting the second connector of the first diode with the second conductive path structure;
        connecting the first connector of the second diode with the second conductive path structure; and
        connecting the second connector of the second diode with the third conductive path structure.

2. The method of assembly of claim 1, wherein fabricating the wire-specific voltage pulse generation main test unit further comprises:
    operatively connecting a processor to at least a non-transitory memory, an output module, and an input module; and
    provisioning and storing a master bit file indicative of proper continuity between the cable under test and the wire-configurable directional connector into the non-transitory memory for comparison with an actual bit file indicative of the actual continuity between the cable under test and the wire-configurable directional connector.

3. The method of assembly of claim 1, wherein fabricating the wire-specific voltage pulse generation main test unit further comprises:
    connecting the wire-specific voltage pulse generation main test unit to a faceplate; and
    enclosing the wire-specific voltage pulse generation main test unit within a protective box.

* * * * *